United States Patent [19]

Nagashima et al.

[11] 4,178,558
[45] Dec. 11, 1979

[54] DC LEVEL CLAMPING CIRCUIT

[75] Inventors: Yoshitake Nagashima, Yokohama; Kazumasa Noyori, Oita; Hideki Moriyama, Yokohama, all of Japan

[73] Assignee: Tokyo Shibaura Electric Co., Ltd., Japan

[21] Appl. No.: 945,850

[22] Filed: Sep. 26, 1978

[30] Foreign Application Priority Data

Oct. 5, 1977 [JP] Japan .................................. 52-119059

[51] Int. Cl.$^2$ ............................................ H03F 21/00
[52] U.S. Cl. ...................................... 330/11; 307/237; 330/69; 330/252; 358/34; 358/172
[58] Field of Search .................. 330/9, 11, 51, 69, 252, 330/261; 307/237; 358/34, 172

[56] References Cited

U.S. PATENT DOCUMENTS 3,308,235  3/1967  Greiner et al. ......................... 358/172

Primary Examiner—James B. Mullins
Attorney, Agent, or Firm—Finnegan, Henderson, Farabow & Garrett

[57] ABSTRACT

A DC level clamping circuit comprising a differential amplifier circuit constituted by a pair of transistors, a signal source, a first capacitor connected between the signal source and a first input terminal of the amplifier circuit, a second capacitor connected between the ground and a second input terminal of the amplifier circuit and having substantially the same capacity as the first capacitor, a pulse generator, a DC power source and first and second switching elements. The first switching element is connected between the DC power source and the first input terminal of the amplifier circuit, and the second switching element between the DC power source and the second input terminal of the amplifier circuit. These switching elements are controlled by the pulses from the pulse generator in a similar manner.

6 Claims, 7 Drawing Figures

DC LEVEL CLAMPING CIRCUIT

BACKGROUND OF THE INVENTION

This invention relates to a DC level clamping circuit.

As shown in FIG. 1, a conventional DC level clamping circuit includes an amplifier 1 and a series circuit of a capacitor 2 and a resistor 3. Through the capacitor 2 and the resistor 3 an output signal of a signal source 4 is supplied to the input terminal of the amplifier 1. The input terminal of the amplifier 1 is coupled to a DC power source 5 through a switch 6. Were the input impedance of the amplifier 1 infinitely large, a leak current would never flow through the amplifier 1, and the clamp voltage on the input terminal of the amplifier 1 would therefore remain constant all the time the switch 6 open.

In practice, however, the input impendance of the amplifier 1 has a finite value. A leak current inevitably flows through the amplifier 1 while the switch 6 remains open. As a result, the clamp voltage will be reduced gradually to cause a so-called "sag phenomenon", and the output voltage of the amplifier 1 will contain a sag component. To suppress such a sag phenomenon, a capacitor of large capacity may be used. But, if the capacitor 2 is formed to have a large capacitance, the transient characteristic of input voltage of the amplifier 1 at the turn-on of the switch 6 inevitably becomes too gentle. This transient characteristics of the input voltage depends on the time constant determined by the capacitance of the capacitor 2 and the resistance in the switch 6 in the turn-on state. Thus, to improve the transient characteristic of the input voltage, it is enough to reduce the resistance of the switch 6 at the turn-on. To achieve this objective, it is necessary that the switch 6 be constituted by a relatively large transistor and that the DC power source 5 have a large current capacity.

SUMMARY OF THE INVENTION

An object of this invention is to provide a DC level clamping circuit which produces output signals without sag component.

According to one aspect of this invention, there is provided a DC level clamping circuit comprising a differential amplifier circuit, a first capacitor with one end connected to a first input terminal of the amplifier circuit and the other end connected to a signal input terminal, a second capacitor with one end connected to the second input terminal of the amplifier circuit and the other end connected to a reference power source terminal, a control signal generating means, and first and second switching means which are connected between a DC power source terminal and the first input terminal of the amplifier circuit and between the DC power source terminal and the second input terminal of the amplifier, respectively, and whose switching states are controlled by control signals from the control signal generating means. cl BRIEF DESCRIPTION OF THE DRAWING FIG. 1 is a circuit diagram of a conventional DC level clamping circuit;

DETAILED DESCRIPTION OF THE PREFERRED EMBODIMENT

Figure 1:
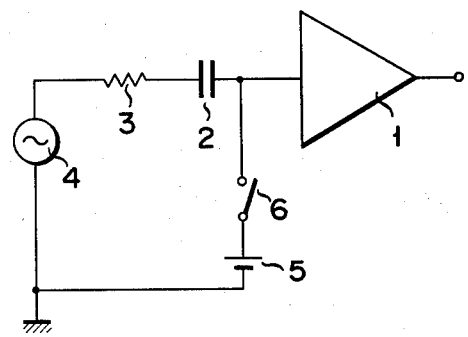
Figure 2:
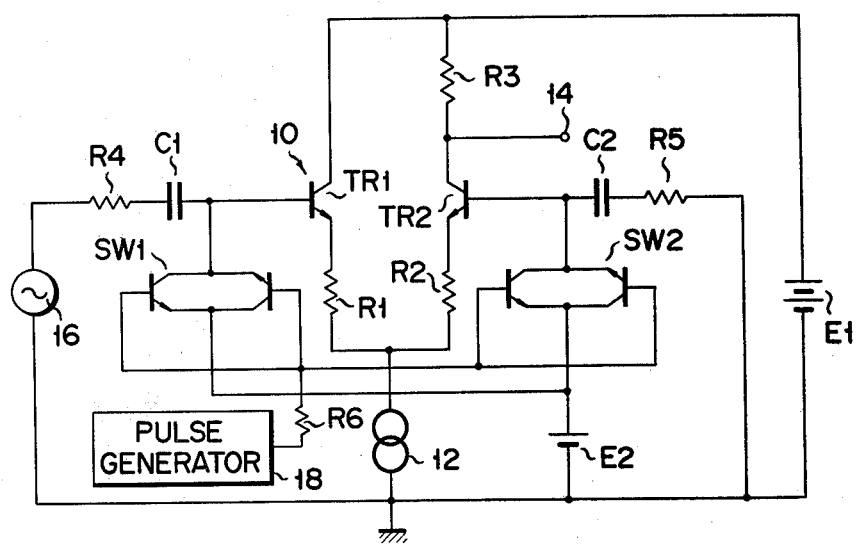
FIG. 2 is a circuit diagram of a DC level clamping circuit according to this invention.

As shown in FIG. 2, a DC level clamping circuit according to this invention has a differential amplifier 10 constituted by a pair of npn transistors TR1 and TR2. The emitters of both transistors TR1 and TR2 are coupled to a power source 12, respectively through two resistors R1 and R2 of the same resistance. The collector of the transistor TR1 is connected to a DC power source E1, and the collector of the transistor TR2 also to the DC power source E1 through a resistor R3 and further to an output terminal 14. The base of the transistor TR1 is coupled to a signal source 16 through a capacitor C1 and a resistor R4, and the base of the transistor TR2 to the ground through a capacitor C2 and a resistor R5. The capacitors C1 and C2 have the same capacity, and the resistors R4 and R5 have the same resistance.

The bases of the transistors TR1 and TR2 are coupled to another DC power source E2, respectively through switching circuits SW1 and SW2. These switching circuits SW1 and SW2 are each constituted by two npn transistors the bases of which receive pulse signals from a switching pulse generator 18 through a resistor R6. The switching circuits SW1 and SW2 are made conductive in response to a high level signal from the switching pulse generator 18.

With reference to FIGS. 3 to 7 there will now be described the operation of the DC level clamping circuit of FIG. 2.

Figure 3:
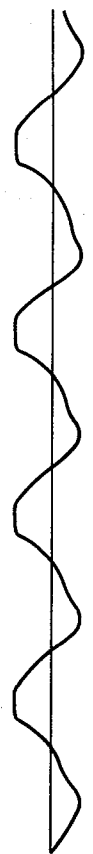
FIG. 3 shows the waveform of an output signal of the signal source used in the DC level clamping circuit shown in FIG. 2.
Figure 4:
FIG. 4 shows the waveform of an output pulse signal of the switching pulse generator used in the DC level clamping circuit shown in FIG. 2.
Figure 5:
FIGS. 5 and 6 shows the waveforms of the base voltages of the transistors constituting the differential amplifier of the DC level clamping circuit shown in FIG. 2.
Figure 6:

Such signals generated by the signal source 16 as shown in FIG. 3 usually have different levels and should therefore be clamped. When the switching circuits SW1 and SW2 become conductive in response to such a pulse from the switching signal generator 18 as illustrated in FIG. 4, the bases of the transistors TR1 and TR2 are supplied with such DC voltages from the DC power source E2 as shown in FIGS. 5 and 6, respectively. Then, the capacitors C1 and C2 are charged to DC voltage E2. Thereafter, the level of the output signal of the switching signal generator 18 is lowered to render both switching circuits SW1 and SW2 nonconductive again. When the switching circuits SW1 and SW2 become non-conductive, the base of the transistor TR1 is applied with a superposed voltage, a combination of the output voltage of the signal source 16 and the voltage across the capacitor C1. At the same time, the base of the transistor TR2 is applied with such voltage across the capacitor C2 as illustrated in FIG. 6.

Figure 7:
FIG. 7 shows the waveform of an output signal of the DC level clamping circuit shown in FIG. 2.

The transistors TR1 and TR2 have the same operation characteristic, and the switching circuits SW1 and SW2 have the same response characteristic. As mentioned already, the capacitors C1 and C2 have the same capacitance, and the resistors R4 and R5 have the same resistance. Consequently, the capacitors C1 and C2 have the same discharge characteristic. For this reason the sag components in the output voltages of the transistors TR1 and TR2 cancel out each other in the differential amplifier 10. As a result, the output terminal 14 of the differential amplifier 10 provides an output voltage which, as shown in FIG. 7, contains no sag component and is clamped. The collector voltage of the transistor TR2 has such a level as indicated by a dotted line in FIG. 7 when the base voltage of the transistor TR1 has the same value as that of the transistor TR1.

This invention is not limited to the above-described embodiment. For example, the differential amplifier 10 and the switching circuits SW1 and SW2 may be constituted by MOS FETs instead of bipolar transistors used in the embodiment of FIG. 2.

What we claim is:

1. A DC level clamping circuit comprising a signal input terminal, a DC power source terminal, a reference power source terminal, a differential amplifier circuit having first and second input terminals, a first capacitor coupled between the signal input terminal and the first input terminal of the differential amplifier circuit, a second capacitor coupled between the reference power source terminal and the second input terminal of the differential amplifier circuit, first and second switching means coupled between the DC power source terminal and the first input terminal of the differential amplifier circuit and between the DC power source terminal and the second input terminal of the differential amplifier circuit, respectively, and control means for controlling the conductive state of the first and second switching means.

2. A DC level clamping circuit according to claim 1, wherein said first and second capacitors have substantially the same capacity.

3. A DC level clamping circuit according to claim 1 or 2, further comprising a resistor connected in series to said first capacitor.

4. A DC level clamping circuit according to claim 1 or 2, further comprising first and second resistors connected in series to said first and second capacitors, respectively.

5. A DC level clamping circuit according to claim 4, wherein said first and second resistors have substantially the same resistance.

6. A DC level clamping circuit according to claim 1 or 2, wherein said first and second switching means are constituted each by first and second transistors of which the bases are coupled to said control means and the emitter-collector paths are coupled between said DC power source terminal and the first input terminal of said differential amplifier circuit and between said DC power source terminal and the second input terminal of said differential amplifier circuit, respectively.

* * * * *